US012641836B2

(12) United States Patent
Takahashi et al.

(10) Patent No.: US 12,641,836 B2
(45) Date of Patent: May 26, 2026

(54) SEMICONDUCTOR DEVICE

(71) Applicants: KOKUSAI ELECTRIC CORPORATION, Tokyo (JP); NATIONAL INSTITUTE OF ADVANCED INDUSTRIAL SCIENCE AND TECHNOLOGY, Tokyo (JP)

(72) Inventors: Masahiro Takahashi, Toyama (JP); Hideki Horita, Toyama (JP); Tatsurou Maeda, Tsukuba (JP)

(73) Assignees: KOKUSAI ELECTRIC CORPORATION, Tokyo (JP); NATIONAL INSITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 788 days.

(21) Appl. No.: 17/928,358

(22) PCT Filed: May 21, 2021

(86) PCT No.: PCT/JP2021/019402
§ 371 (c)(1),
(2) Date: Jul. 21, 2023

(87) PCT Pub. No.: WO2021/241449
PCT Pub. Date: Dec. 2, 2021

(65) Prior Publication Data

US 2024/0282822 A1 Aug. 22, 2024

(30) Foreign Application Priority Data

May 29, 2020 (JP) ................................ 2020-094305

(51) Int. Cl.
*H10D 30/69* (2025.01)
*H10D 30/01* (2025.01)
(Continued)

(52) U.S. Cl.
CPC ........... *H10D 30/751* (2025.01); *H10D 62/80* (2025.01); *H10D 62/834* (2025.01); *H10D 30/0413* (2025.01); *H10D 30/69* (2025.01)

(58) Field of Classification Search
CPC .... H10D 30/751; H10D 62/80; H10D 62/834; H10D 30/0413; H10D 30/69;
(Continued)

(56) References Cited

U.S. PATENT DOCUMENTS

2014/0256156 A1 9/2014 Harada et al.
2015/0255269 A1 9/2015 Harada et al.
(Continued)

FOREIGN PATENT DOCUMENTS

JP 2013-093452 A 5/2013
JP 2014-175320 A 9/2014
(Continued)

OTHER PUBLICATIONS

Nov. 17, 2022 International Preliminary Report on Patentability issued in International Patent Application No. PCT/JP2021/019402.
Jul. 20, 2021 International Search Report issued in International Patent Application No. PCT/JP2021/019402.

*Primary Examiner* — Mohammad A Rahman
(74) *Attorney, Agent, or Firm* — Oliff PLC

(57) ABSTRACT

A semiconductor device, including an insulating film provided on a substrate, a chlorine-containing semiconductor layer provided adjacent to the insulating film, and a semiconductor region provided adjacent to the chlorine-containing semiconductor layer, wherein a chlorine concentration in
(Continued)

300 the chlorine-containing semiconductor layer is $1.0\times10^{20}$ atoms/$cm^3$ or more and $1.0\times10^{22}$ atoms/$cm^3$ or less.

21 Claims, 3 Drawing Sheets

(51) Int. Cl.
*H10D 62/80* (2025.01)
*H10D 62/834* (2025.01)

(58) Field of Classification Search
CPC ...... H10D 30/67; H10D 30/021; H10D 30/60; H10D 30/68; C23C 16/34; C23C 16/40; H10B 43/30
See application file for complete search history.

(56) References Cited

U.S. PATENT DOCUMENTS

| | | | |
|---|---|---|---|
| 2017/0271144 | A1 | 9/2017 | Hashimoto et al. |
| 2018/0190657 | A1* | 7/2018 | Chang ............... H01L 21/31116 |
| 2019/0006386 | A1 | 1/2019 | Yamazaki et al. |
| 2020/0176473 | A1 | 6/2020 | Yamazaki et al. |

FOREIGN PATENT DOCUMENTS

| | | | |
|---|---|---|---|
| JP | WO 2015115330 | A1 * | 6/2015 |
| JP | 2015-142078 | A | 8/2015 |
| JP | 2017-168786 | A | 9/2017 |
| JP | 2019-12822 | A | 1/2019 |
| WO | 2015/115330 | A1 | 8/2015 |

* cited by examiner

SEMICONDUCTOR DEVICE

FIELD

The present disclosure relates to a semiconductor device.

DESCRIPTION OF THE RELATED ART

An exemplary semiconductor device has a structure in which a silicon film is formed above an insulating film provided on a substrate with an intervening seed layer (see, for example, Japanese Patent Laid-Open Publication No. 2014-175320).

SUMMARY

Solution to Problem

An object of the present disclosure is to provide a technique that can improve characteristics of a semiconductor device.

Solution to Problem

According to an aspect of the present disclosure,
there is provided a semiconductor device, including:
an insulating film provided on a substrate,
a chlorine-containing semiconductor layer provided adjacent to the insulating film, and
a semiconductor region provided adjacent to the chlorine-containing semiconductor layer,
wherein a chlorine concentration in the chlorine-containing semiconductor layer is $1.0\times10^{20}$ atoms/$cm^3$ or more and $1.0\times10^{22}$ atoms/$cm^3$ or less.

DETAILED DESCRIPTION

According to the present disclosure, a technique that can improve characteristics of a semiconductor device can be provided.

EMBODIMENTS

One Aspect of Disclosure

An aspect of the present disclosure will be hereinafter described with reference to FIG. 1. It should be noted that the figures used in the following explanation are all schematic, and the relation between sizes of elements, the proportion of each element, and the like in the figure do not necessarily coincide with the actual ones. Also, it should be noted that the relation between sizes of elements, the proportion of each element, and the like do not necessarily coincide with one another, among a plurality of figures.

(1) Structure of Semiconductor Device

Figure 1:
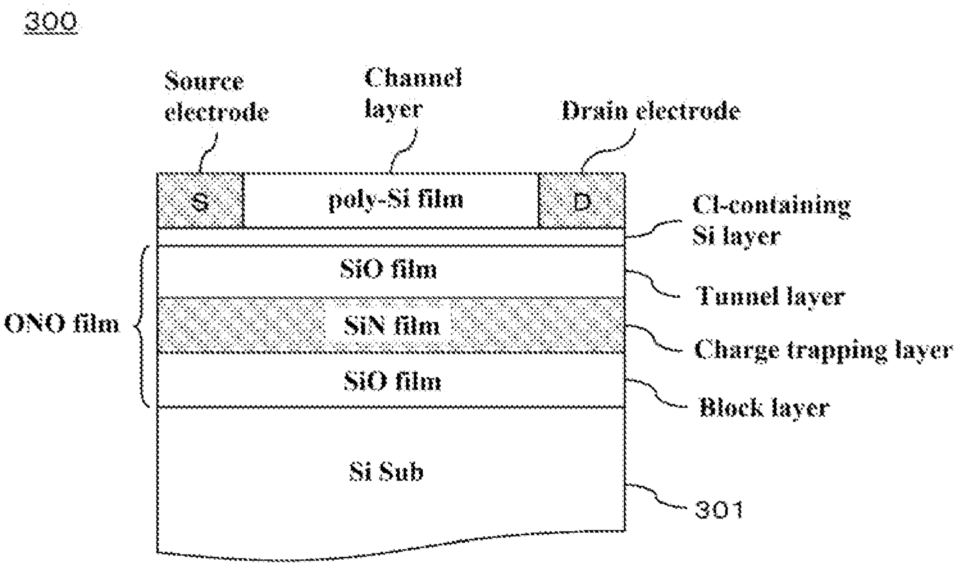
FIG. 1 is a partially enlarged cross-sectional view of the semiconductor device in an aspect of the present disclosure.

FIG. 1 is a partially enlarged cross-sectional view of a SONOS (Silicon-Oxide-Nitride-Oxide-Silicon) structure included in a memory device 300 which is one of the semiconductor devices.

The memory device 300 includes a wafer 301 as a substrate. The wafer 301 is composed of silicon (Si) such as single crystal silicon, for example. The wafer 301 is also referred to as a Si wafer, a semiconductor wafer, a Si substrate, a semiconductor substrate, or the like. On the wafer 301, a silicon oxide film (SiO film) is provided as an insulating film (first insulating film) which functions as a block layer. On the SiO film as the block layer, a silicon nitride film (SiN film) is provided as an insulating film (second insulating film) which functions as a charge trapping layer. On the SiN film as the charge trapping layer, a SiO film is provided as an insulating film (third insulating film) which functions as a tunnel layer. The insulating film as the tunnel layer may be a silicon oxynitride film (SiON film). A tunnel layer composed of a SiO film or a SiON film is also referred to as a tunnel oxide film. Each of the SiO film, the SiN film, and the SiON film is preferably a film containing substantially no chlorine (Cl), that is, a Cl-free film. A film having a laminated structure of SiO film/SiN film/SiO film is also referred to as an ONO film. A film having a laminated structure of SiO film/SiN film/SiO film is also referred to as an ONO film. In this specification, the film having the laminated structure of SiON film/SiN film/SiO film is also referred to as an ONO film for convenience.

On the SiO film as the tunnel layer on the outermost surface of the ONO film, a Cl-containing Si layer containing Cl at a high concentration is provided as a chlorine-containing semiconductor layer. Thus, the SiO film as the tunnel layer (insulating film) and the Cl-containing Si layer are provided adjacent to each other. When the tunnel layer is a SiON film, the SiON film and the Cl-containing Si layer are provided adjacent to each other.

The Cl concentration in the Cl-containing Si layer is, for example, $1.0\times10^{20}$ atoms/$cm^3$ or more and $1.0\times10^{22}$ atoms/$cm^3$ or less, preferably $3.0\times10^{20}$ atoms/$cm^3$ or more and $5.0\times10^{21}$ atoms/$cm^3$ or less.

A thickness of the Cl-containing Si layer is preferably thinner than each of the SiO film as the tunnel layer described above and a poly-Si film as a channel layer described below. The same applies to a case where the tunnel layer is a SiON film. The thickness of the Cl-containing Si layer is, for example, 1 monolayer (hereinafter referred to as ML) or more and 30 Å (3 nm) or less, preferably 2.5 Å (0.25 nm) or more and 30 Å (3 nm) or less, and more preferably 3 Å (0.3 nm) or more and 20 Å (2 nm) or less. Note that 1 ML means a monomolecular layer or a monatomic layer.

On the Cl-containing Si layer, a polycrystalline silicon film (poly-Si film) which contains substantially no Cl, in other words, which is Cl-free, is provided as a semiconductor region which functions as a channel layer. Thus, the poly-Si film as a channel layer (semiconductor region) and the Cl-containing Si layer are provided adjacent to each other. The poly-Si film as the channel layer is composed of a non-doped poly-Si film which contains no dopant such as phosphorus (P) or boron (B). The poly-Si film as the channel layer may be composed of a doped poly-Si film which contains dopant such as P or B.

A source electrode and a drain electrode are provided on both sides of the poly-Si film as the channel layer in an in-main plane direction (surface direction) of the wafer 301 so as to sandwich the poly-Si film between them in the surface direction. Each of the source electrode and the drain electrode is composed of a doped poly-Si film doped with a dopant such as Por B, for example.

(2) Method for Producing Semiconductor Device

Next, an example of the method for producing the memory device 300 will be described.

(Formation of ONO Film)

A SiO film as the block layer, a SiN film as the charge trapping layer, and a SiO film as the tunnel layer are formed in this order on the wafer 301, for example, by CVD method. As described above, a SiON film may be formed as the tunnel layer.

When forming each of the SiO film as the block layer and the SiO film as the tunnel layer, a Si-containing gas and an oxidizing gas, for example, are supplied as processing gases to the surface of the heated wafer 301. When forming the SiN film as the charge trapping layer, for example, a Si-containing gas and a nitriding gas are supplied as processing gases to the surface of the heated wafer 301. When forming the SiON film as the tunnel layer, for example, a Si-containing gas, an oxidizing gas, and a nitriding gas are supplied to the surface of the heated wafer 301.

As the Si-containing gas, for example, chlorosilane-based gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane ($SiCl_4$, abbreviated as STC) gas, hexachlorodisilane gas ($Si_2Cl_6$, abbreviated as HCDS) gas, octachlorotrisilane ($Si_3Cl_8$, abbreviated as OCTS) gas; aminosilane-based gas such as tetrakis(dimethylamino)silane ($Si[N(CH_3)_2]_4$, abbreviated as 4DMAS) gas, tris(dimethylamino)silane ($Si[N(CH_3)_2]_3H$, abbreviated as 3DMAS) gas, bis(diethylamino)silane ($Si[N(C_2H_5)_2]_2H_2$, abbreviated as BDEAS) gas, bis(tert-butylamino)silane ($SiH_2[NH(C_4H_9)]_2$, abbreviated as BTBAS) gas; silicon hydride gas such as monosilane ($SiH_4$, abbreviated as MS) gas, disilane ($Si_2H_6$, abbreviated as DS) gas, trisilane ($Si_3H_8$, abbreviated as TS) gas can be used.

As the oxidizing gas, for example, a gas containing oxygen (O) such as oxygen ($O_2$) gas, ozone ($O_3$) gas, steam ($H_2O_2O$ gas), nitrous oxide ($N_2O$) gas, nitrogen monoxide (NO) gas, nitrogen dioxide ($NO_2$) gas, carbon dioxide ($CO_2$ gas) can be used.

As the nitriding gas, for example, a hydrogen nitride gas which is a gas containing nitrogen (N) and hydrogen (H) such as ammonia ($NH_3$) gas, diazene ($N_2H_2$) gas, hydrazine ($N_2H_4$) gas, $N_3H_8$ gas can be used.

Exemplary processing conditions for a step of forming the SiO film are as follows:

- Si-containing gas supply flow rate: 0.1 to 5 slm
- Oxidizing gas supply flow rate: 0.1 to 10 slm
- Each gas supply time: 1 to 300 min.
- Processing temperature: 350 to 700° C., preferably 350 to 650° C.
- Processing pressure: 133 to 4000 Pa, preferably 667 to 2666 Pa.

Note that, the processing temperature refers to a temperature of the wafer 301 when the processing is performed on the wafer 301, and the processing pressure refers to a pressure in a space in which the wafer 301 exists when the processing is performed on the wafer 301, that is, a pressure in a processing chamber in which the processing is performed on the wafer 301.

Exemplary processing conditions for a step of forming the SiN film are as follows:

- Si-containing gas supply flow rate: 0.1 to 5 slm
- Nitriding gas supply flow rate: 0.1 to 10 slm.
- Other processing conditions may be similar to the processing conditions for the step of forming the SiO film.

Exemplary processing conditions for a step of forming the SiON film are as follows:

- Si-containing gas supply flow rate: 0.1 to 5 slm
- Oxidizing gas supply flow rate: 0.1 to 10 slm
- Nitriding gas supply flow rate: 0.1 to 10 slm.
- Other processing conditions may be similar to the processing conditions for the step of forming the SiO film.

(Formation of Cl-Containing Si Layer)

After the ONO film is formed on the wafer 301, on the SiO film as the tunnel layer composing the uppermost layer of the ONO film, the Cl-containing Si layer containing Cl at a high concentration is formed, for example, by CVD method.

When forming the Cl-containing Si layer, for example, the above-described chlorosilane-based gas is supplied as the processing gas to the heated wafer 301. Further, the above-described silicon hydride gas can be added to the above-described chlorosilane-based gas, which can be supplied as the processing gas.

Exemplary processing conditions for a step of forming the Cl-containing Si layer are as follows:

- Chlorosilane-based gas supply flow rate: 0.1 to 1 slm
- Silicon hydride gas supply flow rate: 0 to 1 slm
- Each gas supply time: 0.5 to 2 min.
- Processing temperature: 350 to 450° C., preferably 350 to 400° C.
- Processing pressure; 667 to 1333 Pa.

The Cl-containing Si layer may be formed by performing predetermined numbers (n, an integer of one or more) of the cycles in which a step of supplying chlorosilane-based gas to the wafer 301 and a step of supplying an inert gas to the wafer 301 are performed non-simultaneously, like a processing sequence shown below. Nitrogen ($N_2$) gas, or a rare gas such as argon (Ar) gas, helium (He) gas, neon (Ne) gas, xenon (Xe) gas can be used as an inert gas.

$$(\text{Chlorosilane-based gas} \rightarrow \text{inert gas}) \times n$$

The Cl-containing Si layer can also be formed by predetermined numbers (n, an integer of 1 or more) of cycles in which a step of supplying the chlorosilane-based gas to the wafer 301, a step of supplying the inert gas to the wafer 301, a step of supplying the silicon hydride gas to the wafer 301, and a step of supplying the inert gas to the wafer are performed 301 non-simultaneously, like a processing sequence shown below.

$$(\text{Chlorosilane-based gas} \rightarrow \text{inert gas} \rightarrow \text{silicon hydride gas} \rightarrow \text{inert gas}) \times n$$

In either case, exemplary processing conditions for a step of supplying the inert gas are as follows:

Inert gas supply flow rate: 0.5 to 20 slm

Inert gas supply time: 10 to 30 seconds

Processing temperature: 350 to 450° C., preferably 350 to 400° C.

Processing pressure: 1 to 30 Pa.

The processing conditions for the step of supplying the chlorosilane-based gas and the step of supplying the silicon hydride gas can be the same as the above-described processing conditions for the step of forming the Cl-containing Si layer.

(Formation of Channel Layer, Source Electrode, and Drain Electrode)

After forming the Cl-containing Si layer on the ONO film, the poly-Si film is formed as the channel layer on the Cl-containing Si layer, for example, by CVD method.

When forming the poly-Si film, for example, the above-described silicon hydride gas which is Cl-free is supplied as the processing gas to the heated wafer 301.

Exemplary processing conditions for a step of forming the channel layer are as follows:

Silicon hydride gas supply flow rate: 0.1 to 5 slm

Silicon hydride gas supply time: 1 to 300 min.

Other processing conditions may be similar to the processing conditions for the step of forming the SiO film.

After forming the channel layer, the source electrode and the drain electrode are formed on the Cl-containing Si layer and on both sides, each on either side, in the surface direction of the poly-Si film as the channel layer.

A series of the processes can produce the memory device 300 including a SONOS structure.

(3) Effect According to this Aspect (a) A Si layer containing Cl at a high concentration is formed at the interface (hereinafter referred to as the Si/SiO interface) between the SiO film as the tunnel layer and the poly-Si film as the channel layer, so that dangling bonds at the Si/SiO interface can be terminated by Cl. Dangling bonds in the Cl-containing Si layer can also be terminated by Cl. As a result, an interface level density at the Si/SiO interface can be reduced, and the electrical characteristics of the device can be improved.

(b) With the Cl concentration in the Cl-containing Si layer being $1.0\times10^{20}$ atoms/cm$^3$ or more and $1.0\times10^{22}$ atoms/cm$^3$ or less, the above-described effects can be enhanced appropriately. Also, with the Cl concentration in the Cl-containing Si layer being $3.0\times10^{20}$ atoms/cm$^3$ or more and $5.0\times10^{21}$ atoms/cm$^3$ or less, the above-described effects can be enhanced more appropriately.

With the Cl concentration in the Cl-containing Si layer being less than $1.0\times10^{20}$ atoms/cm$^3$, the dangling bonds at the Si/SiO interface cannot be sufficiently terminated by Cl, and the interface level density cannot be sufficiently reduced, in some cases. As a result, electrical characteristics of the device cannot be improved in some cases. With the Cl concentration in the Cl-containing Si layer being $1.0\times10^{20}$ atoms/cm$^3$ or more, the dangling bonds at the Si/SiO interface can be sufficiently terminated by Cl, the interface level density can be sufficiently reduced, and the electrical characteristics of the device can be improved. With the Cl concentration in the Cl-containing Si layer being $3.0\times10^{20}$ atoms/cm$^3$ or more, such effects can be further enhanced.

With the Cl concentration in the Cl-containing Si layer being more than $1.0\times10^{22}$ atoms/cm$^3$, the Cl concentration becomes excessive with respect to the dangling-bond density at the Si/SiO interface, causing carrier scattering and degrading the electrical characteristics of the device in some cases. With the Cl concentration in the Cl-containing Si layer being $1.0\times10^{22}$ atoms/cm$^3$ or less, the Cl concentration can be suppressed from becoming excessive with respect to the dangling-bond density at the Si/SiO interface, Cl from causing carrier scattering, and the electrical characteristics of the device from degrading. With the Cl concentration in the Cl-containing Si layer being $5.0\times10^{21}$ atoms/cm$^3$ or less, such effects can be further enhanced.

(c) With the thickness of the Cl-containing Si layer being 1 ML or more and 30 Å or less, the above-described effects can be enhanced. With the thickness of the Cl-containing Si layer being 2.5 Å or more and 30 Å or less, the above-described effects can be further enhanced. With the thickness of the Cl-containing Si layer being 3 Å or more and 20 Å or less, the above-described effects can be still further enhanced.

With the thickness of the Cl-containing Si layer being less than 1 ML, Cl atoms to be added at the Si/SiO interface are not sufficient to terminate the dangling bonds at the Si/SiO interface, sometimes failing to sufficiently reduce the interface level density. As a result, the electrical characteristics of the device cannot be improved in some cases. With the thickness of the Cl-containing Si layer being 1 ML or more, Cl atoms to be added at the Si/SiO interface are sufficient to terminate the dangling bonds at the Si/SiO interface, sufficiently reducing interface level density and improving the electrical characteristics of the device. With the thickness of the Cl-containing Si layer being 2.5 Å or more, such effects can be further enhanced. With the thickness of the Cl-containing Si layer being 3 Å or more, such effects can be still further enhanced.

With the thickness of the Cl-containing Si layer being thicker than 30 Å, Cl may sometimes tend to diffuse to the poly-Si film which is upper than the Cl-containing Si layer. In addition, the amount of Cl at the Si/SiO interface may sometimes become excessive. As a result, the electrical characteristics of the device may sometimes degrade. With the thickness of the Cl-containing Si layer being 30 Å or less, Cl can be suppressed from diffusing to the poly-Si film which is upper than the Cl-containing Si layer, the amount of Cl can be suppressed from becoming excessive at the Si/SiO interface, and the electrical characteristics of the device can be suppressed from degrading. With the thickness of the Cl-containing Si layer being 20 Å or less, such effects can be further enhanced.

(d) Cl is incorporated at the Si/SiO interface in a form of the Cl-containing Si layer, which enables pinpoint (local) addition of Cl only at the Si/SiO interface. As a result, Cl can be suppressed from diffusing and being incorporated into the poly-Si film and the SiO film, and degradation in the film characteristics and degradation in the electrical characteristics due to Cl incorporation into these films can be suppressed.

(e) Cl is incorporated at the Si/SiO interface in the form of the Cl-containing Si layer, which enables introduction of Cl at the interface in such an amount that cannot be supplied by another method such as thermal diffusion or plasma diffusion. Moreover, Cl atoms to be added at the Si/SiO interface can be suppressed from diffusing or being incorporated into the area other than the interface, compared to other atoms (hydrogen, fluorine, etc.) which terminate the dangling bonds at the Si/SiO interface.

(f) Cl is incorporated at the Si/SiO interface in a form of the Cl-containing Si layer, which enables Cl to be fixed at the Si/SiO interface. As a result, Cl can be suppressed from diffusing from the Si/SiO interface to the film adjacent to the interface, enabling maintenance of uniformity in the Cl concentration at the Si/SiO interface.

(g) At least one of the Cl concentration and thickness of the Cl-containing Si layer can be precisely controlled by adjusting the number (n) of cycles when forming the Cl-containing Si layer by the following processing sequence. As a result, at least one of the Cl concentration and amount of Cl at the Si/SiO interface can be precisely controlled.

(Chlorosilane-based gas → inert gas) x n (Chlorosilane-based gas → inert gas → silicon hydride gas → inert gas) x n (h) The above-described effects can be similarly obtained in forming each film or each layer, even when using the various silane-based gases, various oxidizing gases, various nitriding gases, various inert gases.

(4) Modified Example

Figure 2:
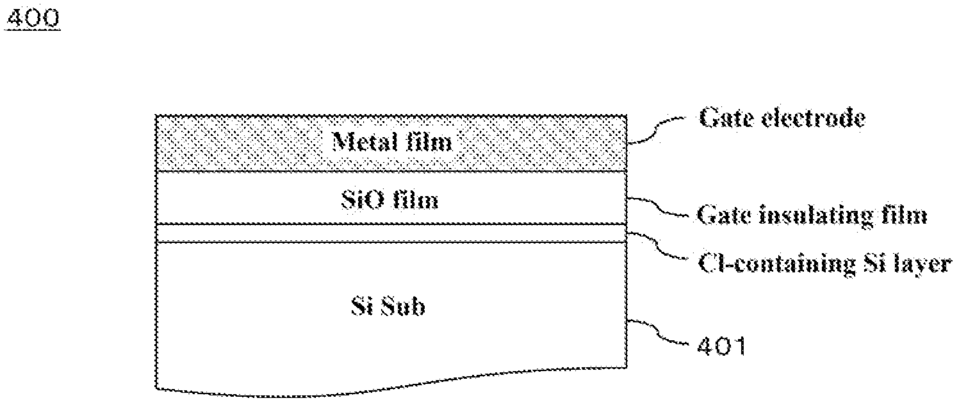
FIG. 2 is a partially enlarged cross-sectional view of the semiconductor device of a modified example in the aspect of the present disclosure.

FIG. 2 is a partially enlarged cross-sectional view of a MIS (Metal-Insulator-Semiconductor) structure included in a transistor device 400, which is a modified example of the semiconductor device in this aspect.

The transistor device 400 includes the wafer 401 as the substrate. The wafer 401 is composed of Si such as single crystal silicon, for example. The wafer 401 includes a predetermined semiconductor region on its surface. On the surface of the wafer 401, a Cl-containing Si layer containing Cl at a high concentration is provided as the chlorine-containing semiconductor layer. As described above, the semiconductor region included in the surface of the wafer 401 and the Cl-containing Si layer as the chlorine-containing semiconductor layer are provided adjacent to each other.

The Cl concentration in the Cl-containing Si layer is, for example, $1.0\times10^{20}$ atoms/$cm^3$ or more and $1.0\times10^{22}$ atoms/$cm^3$ or less, preferably $3.0\times10^{20}$ atoms/$cm^3$ or more and $5.0\times10^{21}$ atoms/$cm^3$ or less.

The thickness of the Cl-containing Si layer is preferably thinner than that of a gate insulating film described later. The thickness of the Cl-containing Si layer is, for example, 1 ML or more and 30 Å or less, preferably 2.5 Å or more and 30 Å or less, and more preferably 3 Å or more and 20 Å or less.

On the Cl-containing Si layer, that is, on the wafer 401, the SiO film is provided as the insulating film which functions as the gate insulating film. As described above, the SiO film as the gate insulating film (insulating film) and the Cl-containing Si layer as the chlorine-containing semiconductor layer are provided adjacent to each other.

On the SiO film is provided the metal-containing film (metal film) which functions as a gate electrode. As the metal film, for example, a tungsten film (W film), a nickel film (Ni film), a cobalt film (Co film) can be used.

The Cl-containing Si layer can be formed, for example, similarly to the Cl-containing Si layer in the above-described aspect. The SiO film can be formed, for example, similarly to the SiO film in the above-described aspect.

The metal film can be formed, for example, by CVD method. A metal-containing gas such as tungsten hexafluoride ($WF_6$) gas or tungsten hexachloride ($WCl_6$) gas, and a reducing agent (reducing gas) such as hydrogen ($H_2$) gas or monosilane ($SiH_4$) gas are supplied as processing gases to the heated wafer 401, for example, when W film is formed as the metal film.

An exemplary processing conditions for a step of forming the metal film are as follows:

Metal-containing gas supply flow rate: 0.1 to 5 slm

Reducing gas supply flow rate: 0.1 to 10 slm

Gas supply time: 1 to 300 minutes

Processing temperature: 100 to 450° C., preferably 200 to 400° C.

Processing pressure: 1 to 4000 Pa, preferably 133 to 2666 Pa.

An effect similar to those described above can also be obtained in this modified example.

EXAMPLES

Example 1

Figure 3A:
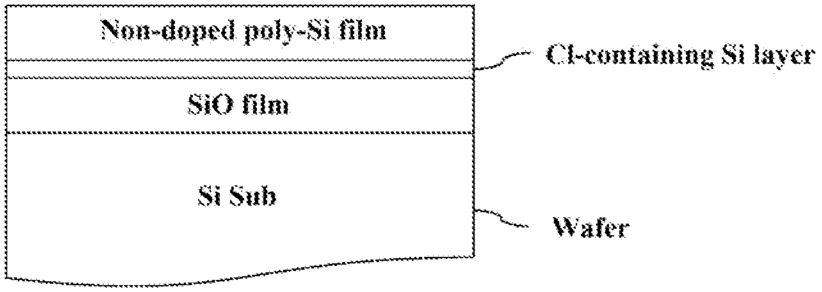
FIG. 3A is a partially enlarged cross-sectional view of an evaluation sample of Example 1 in an aspect of the present disclosure.
Figure 3B:
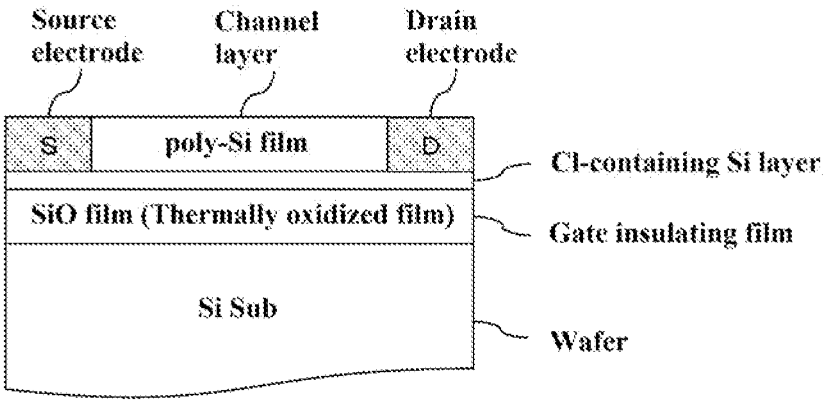
FIG. 3B is a partially enlarged cross-sectional view of an evaluation sample of Example 2 in an aspect of the present disclosure.

A Cl-free SiO film was formed as the insulating film on a wafer as the Si substrate. Then, a Cl-containing Si layer as the chlorine-containing semiconductor layer was formed on the SiO film so as to be adjacent to the SiO film. After that, a Cl-free non-doped poly-Si film which is the semiconductor film as the semiconductor region was formed on the Cl-containing Si layer so as to be adjacent to the Cl-containing Si layer to prepare an evaluation sample of Example 1. FIG. 3(*a*) shows a partially enlarged cross-sectional view of the evaluation sample of Example 1. The processing procedures and processing conditions for forming each film or layer included in the evaluation sample were similar to the processing procedures and processing conditions for each step in the above-described aspect. As evaluation samples, a plurality of samples with different Cl concentrations in the Cl-containing Si layer were prepared. The dangling-bond density of each evaluation sample was measured.

Figure 4:
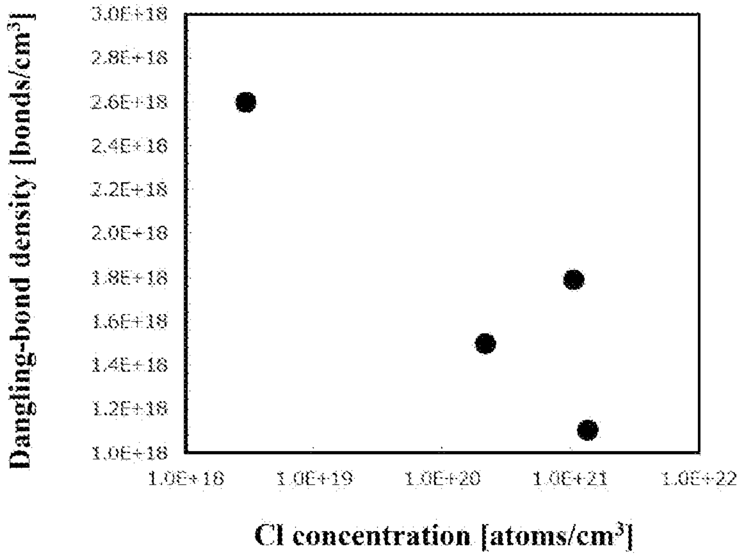
FIG. 4 is a plot illustrating the relation between chlorine concentration and dangling-bond density of Example 1 in an aspect of the present disclosure.

FIG. 4 shows a relation between the Cl concentration and the dangling-bond density at the interface (hereinafter referred to as Si/SiO interface) between the non-doped poly-Si film and the SiO film, that is, the dependency of the dangling-bond density on the Cl concentration at the Si/SiO interface, for each evaluation sample. In FIG. 4, the horizontal axis indicates the Cl concentration [atoms/$cm^3$] at the Si/SiO interface, and the vertical axis indicates the dangling-bond density [bonds/$cm^3$] at the Si/SiO interface. The marks ● in the figure indicate plots of the measured values of the dangling-bond density in each evaluation sample.

As can be seen from FIG. 4, the higher the Cl concentration at the Si/SiO interface, the lower the dangling-bond density. In particular, with the Cl concentration at the Si/SiO interface being $1.0\times10^{20}$ atoms/$cm^3$ or more, preferably $3.0\times10^{20}$ atoms/$cm^3$ or more, the dangling-bond density can be significantly reduced.

Example 2

The Cl-free SiO film as the insulating film (gate insulating film) was formed on the wafer as the Si substrate by a thermal oxidation method. As the wafer, an n-type low-resistivity substrate doped with P at a high concentration was used. Then, the Cl-containing Si layer as the chlorine-containing semiconductor layer was formed on the SiO film so as to be adjacent to the SiO film.

Then, on the Cl-containing Si layer, a Cl-free poly-Si film which is a semiconductor film was formed as the semiconductor region which functions as the channel layer, so as to be adjacent to the Cl-containing Si layer. The source electrode and the drain electrode were formed on both sides, each on either side, in the surface direction of the poly-Si film as the channel layer, to prepare an evaluation sample (FET device) of Example 2. FIG. 3(*b*) is a partially enlarged cross-sectional view of the evaluation sample of Example 2. Except for the SiO film, which is a thermally oxidized film, the processing procedures and processing conditions for forming each film or each layer included in the evaluation sample were the same as the processing procedures and processing conditions for each step in the above-described aspect. As evaluation samples, a plurality of samples with different Cl concentrations in the Cl-containing Si layer were prepared. Then, electron field effect mobility (FET mobility) in the evaluation sample was measured.

Figure 5:
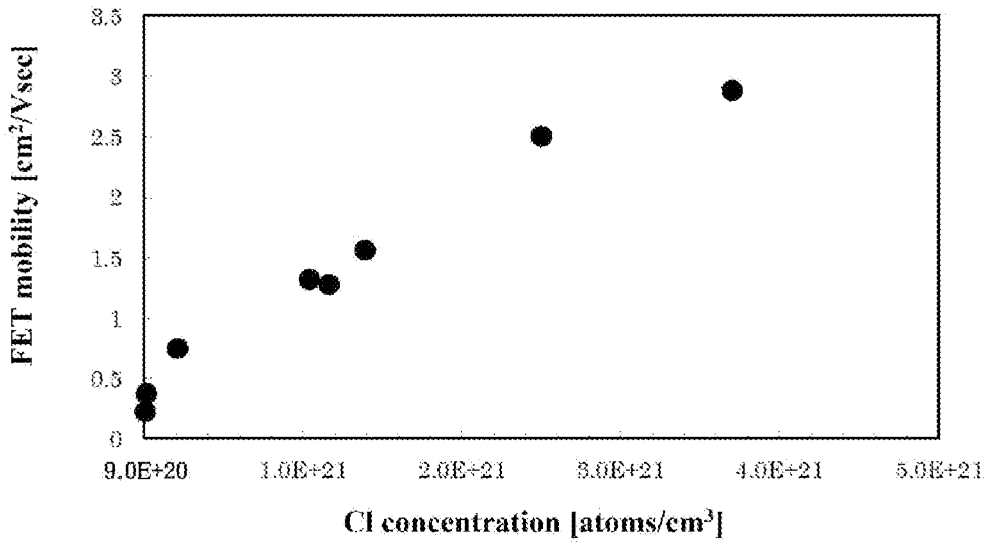
FIG. 5 is a plot illustrating the relation between chlorine concentration and FET mobility of Example 2 in an aspect of the present disclosure.

FIG. 5 shows a relation between the Cl concentration and the FET mobility at the interface (hereinafter referred to as Si/SiO interface) between the poly-Si film as the channel layer and the SiO film as the gate insulating film, that is, the dependency of the electron field effect mobility on the Cl concentration at the Si/SiO interface, for each sample. In FIG. 5, the horizontal axis indicates the Cl concentration [atoms/$cm^3$] at the Si/SiO interface, and the vertical axis indicates the FET mobility [$cm^2$/Vsec]. The marks ● in the figure indicate plots of the measured values of the FET mobility in each evaluation sample.

As can be seen from FIG. 5, the higher the Cl concentration at the Si/SiO interface, the higher FET mobility is obtained. The present disclosers have confirmed that with the Cl concentration at the Si/SiO interface being $1.0\times10^{20}$ atoms/$cm^3$ or more, preferably $3.0\times10^{20}$ atoms/$cm^3$ or more, the FET mobility can be enhanced. As can be seen from FIG. 5, particularly with the Cl concentration at the Si/SiO interface being $9.0\times10^{20}$ atoms/$cm^3$ or more, preferably $1.0\times10^{21}$ atoms/$cm^3$ or more, the FET mobility can be further enhanced.

Other Aspects of Disclosure

The aspects of the present disclosure have been specifically explained. However, the present disclosure is not limited to the above-described aspects, and can be variously modified within a range not departing from the gist of the disclosure.

For example, in the above-described aspect, a case where the semiconductor in each of the chlorine-containing semiconductor layer and the semiconductor region contains Si. However, examples of the semiconductor in the chlorine-containing semiconductor layer and semiconductor region are not limited to those containing Si. The semiconductor may contain at least one of germanium (Ge), silicon-germanium (SiGe), and silicon-germanium-tin (SiGeSn). That is, the semiconductor in the chlorine-containing semiconductor layer and in the semiconductor region may include not only unitary material such as Si or Ge, but also multi-component mixed crystal-based material, for example, binary mixed crystal-based material such as SiGe or ternary mixed crystal-based material such as SiGeSn. The method of the present disclosure can also be applied when using a material effective as a channel layer, such as semiconductor based on a compound which can be used with other channel, oxide-based semiconductor, two-dimensional semiconductor. Also in these cases, the same effects as those in the above-described aspects can be obtained.

The invention claimed is:

1. A semiconductor device, comprising:
an insulating film provided on a substrate,
a chlorine-containing semiconductor layer provided adjacent to the insulating film, and
a semiconductor region provided adjacent to the chlorine-containing semiconductor layer,
wherein a chlorine concentration in the chlorine-containing semiconductor layer is $1.0\times10^{20}$ atoms/$cm^3$ or more and $1.0\times10^{22}$ atoms/$cm^3$ or less, and
each of the insulating film and the semiconductor region is chlorine free.

2. The semiconductor device according to claim 1, wherein the chlorine concentration in the chlorine-containing semiconductor layer is $3.0\times10^{20}$ atoms/$cm^3$ or more and $5.0\times10^{21}$ atoms/$cm^3$ or less.

3. The semiconductor device according to claim 1, wherein a thickness of the chlorine-containing semiconductor layer is 1 monolayer or more and 30 Å or less.

4. The semiconductor device according to claim 1, wherein a thickness of the chlorine-containing semiconductor layer is 2.5 Å or more and 30 Å or less.

5. The semiconductor device according to claim 1, wherein a thickness of the chlorine-containing semiconductor layer is 3 Å or more and 20 Å or less.

6. The semiconductor device according to claim 1, wherein a thickness of the chlorine-containing semiconductor layer is thinner than a thickness of each of the insulating film and the semiconductor region.

7. The semiconductor device according to claim 1, wherein the insulating film is provided on the substrate, the chlorine-containing semiconductor layer is provided on the insulating film, and a semiconductor film is provided as the semiconductor region on the chlorine-containing semiconductor layer.

8. The semiconductor device according to claim 1, wherein a surface of the substrate includes the semiconductor region, the chlorine-containing semiconductor layer is provided on the semiconductor region, and the insulating film is provided on the chlorine-containing semiconductor layer.

9. The semiconductor device according to claim 1, wherein the insulating film includes at least one of a silicon oxide film, a silicon nitride film, and a silicon oxynitride film.

10. The semiconductor device according to claim 1, wherein semiconductor in the chlorine-containing semiconductor layer and the semiconductor region contains at least one of silicon, germanium, silicon-germanium, and silicon-germanium-tin.

11. A semiconductor device, comprising:
an insulating film provided on a substrate,
a chlorine-containing semiconductor layer provided on the insulating film, and
a semiconductor film provided on the chlorine-containing semiconductor layer,
wherein a chlorine concentration in the chlorine-containing semiconductor layer is $1.0\times10^{20}$ atoms/$cm^3$ or more and $1.0\times10^{22}$ atoms/$cm^3$ or less, and
each of the insulating film and the semiconductor film is chlorine free.

12. The semiconductor device according to claim 7, wherein
the insulating film includes a first insulating film, a second insulating film formed on the first insulating film, and a third insulating film formed on the second insulating film, the first insulating film includes a silicon oxide film, the second insulating film includes a silicon nitride film, and the third insulating film includes a silicon oxide film or a silicon oxynitride film.

13. The semiconductor device according to claim 12, wherein semiconductor in the chlorine-containing semiconductor layer contains at least one of silicon, germanium, silicon-germanium, and silicon-germanium-tin.

14. A semiconductor device, comprising:

a chlorine-containing semiconductor layer provided on a semiconductor region of a substrate including the semiconductor region on a surface thereof, and an insulating film provided on the chlorine-containing semiconductor layer, wherein a chlorine concentration in the chlorine-containing semiconductor layer is $1.0\times10^{20}$ atoms/$cm^3$ or more and $1.0\times10^{22}$ atoms/$cm^3$ or less, and each of the insulating film and the semiconductor region is chlorine free.

15. The semiconductor device according to claim 8, wherein the insulating film includes a silicon oxide film.

16. The semiconductor device according to claim 15, wherein semiconductor in the chlorine-containing semiconductor layer and the semiconductor region contains at least one of silicon, germanium, silicon-germanium, and silicon-germanium-tin.

17. The semiconductor device according to claim 8, wherein a metal-containing film is formed on the insulating film.

18. The semiconductor device according to claim 17, wherein the metal-containing film includes at least any of a tungsten film, a nickel film, and a cobalt film.

19. The semiconductor device according to claim 14, wherein the insulating film includes a first insulating film, a second insulating film formed on the first insulating film, and a third insulating film formed on the second insulating film, the first insulating film includes a silicon oxide film, the second insulating film includes a silicon nitride film, and the third insulating film includes a silicon oxide film or a silicon oxynitride film.

20. The semiconductor device according to claim 14, wherein the insulating film includes a silicon oxide film.

21. The semiconductor device according to claim 14, wherein a metal-containing film is formed on the insulating film.

* * * * *